(12) United States Patent
Kirchmeier et al.

(10) Patent No.: US 7,705,676 B2
(45) Date of Patent: Apr. 27, 2010

(54) CLASS D AMPLIFIER ARRANGEMENT

(75) Inventors: Thomas Kirchmeier, Teningen (DE);
Michael Glueck, Freiburg (DE); Gerd Hintz, Pfaffenweiler (DE)

(73) Assignee: HUETTINGER Elektronik GmbH + Co. KG, Freiburg (DE)

( * ) Notice: Subject to any disclaimer, the term of this patent is extended or adjusted under 35 U.S.C. 154(b) by 61 days.

(21) Appl. No.: 12/044,572

(22) Filed: Mar. 7, 2008

(65) Prior Publication Data
US 2008/0218264 A1 Sep. 11, 2008

(30) Foreign Application Priority Data
Mar. 9, 2007 (EP) .................................. 07004878

(51) Int. Cl.
*H03F 3/217* (2006.01)
(52) U.S. Cl. ...................................... 330/251
(58) Field of Classification Search ............. 330/207 A, 330/251
See application file for complete search history.

(56) References Cited

U.S. PATENT DOCUMENTS

| | | | |
|---|---|---|---|
| 4,733,137 A | 3/1988 | Dunham | |
| 5,077,595 A | 12/1991 | Fukunaga | |
| 5,103,283 A | 4/1992 | Hite | |
| 5,113,145 A | 5/1992 | Ideler et al. | |
| 5,306,986 A * | 4/1994 | Siao ........................... | 315/248 |
| 5,398,160 A | 3/1995 | Umeda | |
| 5,646,445 A | 7/1997 | Masumoto et al. | |
| 6,020,636 A | 2/2000 | Adishian | |
| 6,222,260 B1 | 4/2001 | Liang et al. | |
| 6,229,388 B1 | 5/2001 | Nalbant | |
| 6,291,880 B1 | 9/2001 | Ogawa et al. | |
| 6,373,705 B1 | 4/2002 | Koelle et al. | |
| 6,636,429 B2 | 10/2003 | Maly et al. | |
| 6,750,711 B2 * | 6/2004 | Chawla et al. .............. | 330/251 |
| 6,777,881 B2 | 8/2004 | Yuzurihara et al. | |

(Continued)

FOREIGN PATENT DOCUMENTS

DE 3134680 4/1982

(Continued)

OTHER PUBLICATIONS

Attwood, B., "Design Parameters Important for the Optimization of Very-High-Fidelity PWM (Class D) Audio Amplifiers", Journal of Audio Engineering Society, No. 11, Nov. 1983, pp, 842-853.

(Continued)

*Primary Examiner*—Steven J Mottola
(74) *Attorney, Agent, or Firm*—Fish & Richardson P.C.

(57) ABSTRACT

An amplifier arrangement for operation at supply voltages of at least 100V and at output powers of at least 1 kW includes a half-bridge formed from two switching elements connected in series, two supply voltage terminals, and an output connection between the switching elements. A bypass capacitor is in parallel with the switching elements, and a current path is through the switching elements and the bypass capacitor, where the current path has a length of 10 cm or less, the half-bridge and the bypass capacitor are arranged on an area of 30 cm2, and a resonant circuit formed by capacitances and inductances in the current path has a resonance frequency of 100 MHz or greater.

27 Claims, 3 Drawing Sheets

U.S. PATENT DOCUMENTS

| | | |
|---|---|---|
| 6,784,538 B2 | 8/2004 | Nakamura et al. |
| 6,906,404 B2 | 6/2005 | Maly et al. |
| 7,034,345 B2 | 4/2006 | Chang et al. |
| 7,081,671 B2 | 7/2006 | Fukada et al. |
| 2004/0179341 A1 | 9/2004 | Kimoto et al. |
| 2005/0088855 A1 | 4/2005 | Kirchmeier et al. |
| 2005/0146257 A1 | 7/2005 | Trujillo et al. |
| 2008/0116971 A1* | 5/2008 | McMorrow ................. 330/251 |

FOREIGN PATENT DOCUMENTS

| | | |
|---|---|---|
| DE | 3908996 | 9/1990 |
| DE | 102005036116 | 2/2007 |
| EP | 0427143 | 5/1991 |
| EP | 1 601 015 | 11/2005 |
| EP | 1 601 098 | 11/2005 |
| FR | 2681187 | 3/1993 |
| KR | 20040096374 | 11/2004 |

OTHER PUBLICATIONS

"Designer's Guide to Power Products, Application Manual", $2^{nd}$ Edition, SGS Microelectronics, 1990, 16 pages.

Fujita et al., "A 2-MHz 2-kW Voltage-Source Inverter for Low-Temperature Plasma Generators: Implementation of Fast Switching with a Third-Order Resonant Circuit", IEEE Transactions of Industry Applications, vol. 35, No. 1, Jan./Feb. 1999, pp. 21-27.

Advanced Power Technology—ARF1510, 2005, 2 pages.

Advanced Power Technology—ARF1511, 2005, 2 pages.

Advanced Power Technology—DRF1200, 2006, 8 pages.

International Search Reports for corresponding European Application No. 07004878.0, mailed Jul. 3, 2007 and Sep. 6, 2007.

* cited by examiner

CLASS D AMPLIFIER ARRANGEMENT

CROSS REFERENCE TO RELATED APPLICATION

This application claims priority under 35 U.S.C. § 119(a) to European Application No. 07 004 878.0, filed on Mar. 9, 2007, the entire contents of which are hereby incorporated by reference.

TECHNICAL FIELD

This disclosure relates to a high-frequency (HF) Class D amplifier arrangement, suitable for operation at supply voltages of at least 100V and at output powers of at least 1 kW.

BACKGROUND

"High frequency" is the term normally used when the signal propagation delay of a signal from point A to point B on a conductor path is close to the duration of the period of the signal. Frequencies of 3 MHz or higher can be considered high frequency. At high frequencies, conductor path lengths and characteristics of the conductors play a significant role. At high frequencies, it generally cannot be assumed that a signal occurring at a first position along a conductor also occurs at the same time at a second position along the conductor, where the second position is a few centimeters away from the first position and connected to the first position by a conductor path. Generally, the signal does not reach the second position until a few nanoseconds after reaching the first position, and the signal has possibly changed in value when the signal reaches the second position. Thus, for high frequencies (e.g., frequencies of 3 MHz or higher) appropriate technologies are used. Known technologies designed for use with lower frequencies generally are not directly usable for high frequency applications.

For the excitation of plasma processes using high frequencies (e.g., for RF-sputtering, etching or for excitation of gas lasers), other suitable devices along with linear amplifiers (such as Class A and B amplifiers) are primarily HF generators including one or more switching elements. The switching elements can be Class D or Class E amplifiers. In Class E amplifiers, the voltages on the switching elements (e.g., transistors) can increase to over three times that of the DC-supply voltages while the Class D amplifier formed from a bridge limits the voltages on the transistors to the supply voltage.

In the Class D amplifier, two switching elements connected in series, e.g. MOSFETS, are often used. This amplifier arrangement can be referred to as a half-bridge. The usual circuit for a half-bridge is arranged as follows. The higher transistor or switch at the positive DC supply voltage (High Side Switch, HSS) is connected with a drain terminal to the positive DC supply voltage (+V) and the source terminal of the higher transistor is connected to the drain terminal of the lower transistor or switch (Low Side Switch, LSS). The source terminal of the lower transistor is connected to the negative DC-supply voltage (−V). The output signal of the half-bridge is tapped between the two switching elements (e.g., the output signal is tapped at the source of the higher transistor and the drain of the lower transistor). Both the lower and the higher transistors are driven via their respective gate terminals (control terminal).

The lower and higher transistors can be a MOSFET driver hybrid DRF 1200 from the Advanced Power Technology company is a MOSFET with an integrated driver component. A half-bridge with bypass capacitor is described in U.S. Pat. No. 7,161,818.

SUMMARY

In one general aspect, an amplifier arrangement for operation at supply voltages of at least 100 V and at output powers of at least 1 kW includes a half-bridge formed from two switching elements connected in series, two supply voltage terminals, and an output connection between the switching elements. A bypass capacitor is in parallel with the switching elements, and a current path is through the switching elements and the bypass capacitor, where the current path has a length of 10 cm or less, the half-bridge and the bypass capacitor are arranged on an area of 30 cm$^2$, and a resonant circuit formed by capacitances and inductances in the current path has a resonance frequency of 100 MHz or greater.

In another general aspect, an amplifier arrangement includes a half-bridge formed from a first switching element and a second switching element connected in series, first and second supply voltage terminals, and an output connection between the first and second switching elements, a bypass capacitor in parallel with the first and second switching elements, and a current path through the first and second switching elements and the bypass capacitor. The current path includes a first connection lead between the first switching element and the bypass capacitor and a second connection lead between the second switching element and the bypass capacitor, and the first and second connection leads are no longer than 10 mm each.

Implementations may include one or more of the following features. The first and second connection leads may be no longer than 5 mm each. The first and second connection leads may be no longer than 3 mm each. The first and second switching elements may be MOSFETs, and the first and second switching elements may be connected in series and constructed as semiconductor components arranged on a common substrate that includes connection lead sections. Driver components in the form of semiconductor components may be arranged on the substrate. Multiple parallel terminal leads may be arranged between the semiconductor components and connection lead sections of the substrate such that the semiconductor components and the connection lead sections are electrically connected. At least two semiconductor components may be directly connected.

In some implementations, a first control terminal and a second control terminal may be respectively associated with the first and second switching elements, and at least one driver arrangement may be connected to the first and second control terminals. The connection leads from the driver arrangement to the first and second switching elements may have a length of 10 mm or less. The half-bridge and the bypass capacitor may be integrated in a semiconductor component. The first and second switching elements may be arranged on a heat sink. The heat sink may include a ceramic material. The first switching element may be arranged above the second switching element, and the bypass capacitor may be arranged above the second switching element. The bypass capacitor may be constructed as a substrate on which the first and second switching elements are arranged. The half-bridge and the bypass capacitor may be combined together into a module. Ground connections may be the only connection between the module and a heat sink. The heat sink may be connected to ground through a connection lead, and a length of the connection lead is 10 mm or less.

In some implementations, first and second capacitors may be connected in series between the first and second supply voltage terminals and the midpoint of the first and second capacitors may have no direct connection to the midpoint of the half-bridge. The first and second capacitors and the first and second switching elements may be arranged on a substrate. Terminal leads to the first and second capacitors may have a length of 10 mm or less. Third and fourth capacitors may be respectively between the first and second supply voltages and ground, respectively.

In some implementations, the first and second connection leads may each have a width that is comparable with a length of the first and second connection leads, respectively. The amplifier may be a class D amplifier.

In another general aspect, a generator includes an amplifier arrangement that includes a half-bridge formed from a first switching element and a second switching element connected in series, first and second supply voltage terminals, and an output connection between the first and second switching elements, a bypass capacitor in parallel with the first and second switching elements, and a current path through the first and second switching elements and the bypass capacitor. The current path includes a first connection lead between the first switching element and the bypass capacitor and a second connection lead between the second switching element and the bypass capacitor. The first and second connection leads are no longer than 10 mm each. The generator also includes an output network configured to connect the amplifier to a plasma chamber through the output connection.

Switching elements (such as MOSFETs) have an output capacitance, which is not negligible in high-frequency applications. For example, the output capacitance for MOSFETs is a drain-source capacitance, $C_{oss}$. At each switch-on operation with voltage applied, a MOSFET discharges its own drain-source capacitance via its on-resistance $R_{DSON}$ and consumes power in the process according to ($\frac{1}{2} CU^2$), where "C" represents the capacitance of the MOSFET and "U" is the energy in the capacitance that is consumed when the capacitance is discharged. The higher the frequency at which the MOSFET is switched on and off, the more energy that is converted into heat in the MOSFET. In the half-bridge one of the MOSFETs also recharges the drain-source capacitance of the other MOSFET, which at this point is inhibited, also causing an oscillation to be excited between the capacitance of the MOSFET and the inductance of the supply lead. Therefore, the MOSFETs of the half-bridge, when in switching mode at high-frequency and at high operating voltage, should switch on without potential. This is achieved by an inductive component of the load impedance, which, when a MOSFET is blocking, still allows sufficient current to continue flowing to recharge the capacitances of the MOSFET up to the counter-potential, before the other MOSFET switches on. The satisfaction of this condition is referred to as Zero Voltage Switching (ZVS).

In plasma processes, changes in load occur very frequently, and the changes in load can lead to load mismatches. Although these load mismatches can be overcome by the use of impedance matching networks, the impedance matching networks cause a time delay and often also incompletely correct the load mismatch. The interaction of switching bridge and load impedance for Class D operation can inhibit zero voltage switching when load mismatches occur.

The development of Class D amplifiers in high-frequency engineering (e.g., frequencies above 3 MHz) at high voltages and powers (e.g., 1 kW and higher) has been considered challenging for several reasons. Transistors for high power levels (1 kW and greater) have specific space requirements, because such transistors dissipate heat energy (see above, discharging of a capacitance via $R_{DSON}$) and distribute the current over a certain minimum surface area. The higher the voltage at which the transistors are operated, the greater the required distance between the terminal pins. This makes certain minimum dimensions desirable.

The current path from the positive supply voltage through the two transistors to the negative supply voltage is called the load current path. In addition to the load current path however there exists a parasitic current path. The parasitic current path includes a bypass capacitor between the positive supply voltage and the negative supply voltage. The bypass capacitor prevents voltage dips in the supply voltage due to current pulses occurring during switching in the switching transistors. Moreover, the bypass capacitor prevents the destruction of the transistors due to current spikes. When connecting two transistors together to form a half-bridge and when connecting the bypass capacitor, parts of the load current path and parts of the parasitic current path are connected together to form a current path (loop), which includes the switching transistors and the bypass capacitor. Supply leads from the supply voltage terminals are not included in this current path. This current path has supply-lead inductances and capacitances, e.g. the output capacitance of the MOSFETs ($C_{oss}$), and thus forms a resonant circuit. This resonant circuit is excited by the switching on and off of the transistors. If this resonant circuit is excited, e.g. if the zero voltage switching can no longer be achieved, it oscillates mostly at much higher frequencies (e.g. 80 MHz) than the fundamental frequency (e.g. 13.56 MHz). These oscillations are unwanted in the plasma process and interfere with the functioning and the reliability of the HF generator in which the half-bridge is used. An effective damping of the resonant circuit is associated with power loss, which is undesirable for this high-power domain. As a result, Class D amplifiers have not generally been used for high power levels, in particular in plasma processes, and instead recourse was made to the amplifiers of Class B or C, which have a higher dissipation loss as compared to Class D amplifiers, or to a Class E amplifier. On the transistor of a Class E amplifier, relatively high voltages occur, so that more voltage-resistant and more expensive transistors are used. In those places where Class D amplifiers have been used at high power for plasma processes, the output signal was often not of the required quality and had too great a proportion of harmonics. These Class D amplifiers are generally not suitable for the constantly increasing requirements on processing quality.

In voltage fed half-bridges both transistors are not in the conducting state at the same time, because if both transistors are in the conducting state at the same time the supply voltage is short-circuited. As the frequency increases, it becomes more difficult to ensure that both transistors are not simultaneously in the conducting state. The voltage at the gate of the transistors determines the switching on and off of the transistors. The long supply leads, which are used with high power transistors because of the minimum spacing to be maintained, have supply-lead inductances. The gate has capacitances to the source and drain. If the voltage at the gate-terminal of the transistor is set to a level that is intended to switch the transistor on or off, this voltage is not actually effective at the gate until after a recharging time, which is dependent on the gate capacitances and terminal inductances. As these gate capacitances and supply-lead inductances tend to cause oscillations, generally other resistances for damping the oscillations are used. These resistances additionally increase the recharging times.

Manufacturing tolerances of the individual transistors can cause challenges because variations in the transistors resulting from the manufacturing process can cause different transistors to have different threshold voltages, for which reason transistors are often characterized and selected for use in bridge circuits. Moreover, the recharging time is different in length from transistor to transistor. The time differences are frequently in a time range that cannot be neglected at high frequencies. Finally, the synchronization of the transistors can be challenging.

The capacitances in the current path resulting from the current load path circuit and parasitic current path are connected in series, that is to say, the total capacitance is essentially determined by the smallest capacitances. The smallest capacitances are usually the output capacitances in the transistors. The output capacitances generally cannot be arbitrarily reduced. The output capacitances are determined by the surface area of the transistors, which depends in turn on the current carrying capacity and thus ultimately on the power that the half-bridge is to be able to switch.

A small length current path allows construction of an amplifier arrangement that has particularly low inductance. The unwanted oscillations that occur when a zero voltage switching is not possible due to a varying load are therefore shifted to high frequencies that are easier to damp, or due to the limiting of the switching speed of the switching elements, can no longer even arise at all. Such an amplifier arrangement is particularly suited for use in HF generators for power levels above 1 kW with supply voltages above 100V and frequencies of 3 MHz and higher.

In some implementations, the half-bridge and the bypass capacitor are arranged on an area of 30 cm$^2$ or less, inductances in the current path can be kept so small that interfering parasitic oscillations are prevented or shifted to such high frequencies that they no longer cause interference or can be suppressed. The local concentration of the oscillation circuit reduces its influence on other circuits, in particular on the clock signal generation.

In some implementations, the (parasitic) resonant circuit formed by capacitances and inductances in the current path through the half-bridge and the bypass capacitor has a resonance frequency at or above 100 MHz, the resonance frequency arising from mismatches can be easily damped. As the capacitance $C_{oss}$ remains constant, a higher resonance frequency means that a higher discharge current occurs earlier, which in turn leads to increased Ohmic damping (Ohmic losses).

In some implementations, the connection leads between the bypass capacitor and the switching elements and between the switching elements are each of length of 10 mm or less, preferably 5 mm or less, and particularly preferably 3 mm or less, the switching elements are hard-wired together with particularly low inductance. Terminal leads (bonding wires) are here understood to be a component of the connection leads. The short leads cause a shortening of the current path through the two switching elements and the parallel bypass capacitor, and thus a reduction of the inductances. The connection leads can have a planar embodiment, for example a connection lead can be constructed as a flat surface, e.g. as a copper track, or using many parallel conductors perhaps with the same width and length. The width and length of the connection leads, whereby the width can be defined by multiple parallel single connection leads, are therefore of the same order of magnitude. Preferably, the length and width of the connection leads are the same. This reduces the inductance of the conductor path.

In one implementation, at least one driver arrangement can be provided. The drive arrangement is connected to the control terminals of the switching elements, the connection leads from the driver arrangement to the switching elements having a length of 10 mm or less, preferably 5 mm or less, particularly preferably 3 mm or less. This means that the inductances in the connection leads can also be reduced, so that a low-inductance connection of the driver arrangement is possible. If the driver arrangement is arranged closer to the switching elements, in particular to the gates of the MOSFETs, the MOSFETs are less susceptible to the Miller-feedback of the oscillation in the parasitic resonant circuit.

In some implementations, the half-bridge and the bypass capacitor can be arranged on a common substrate. The drivers for the transistors can also be arranged on the substrate. Particularly low-inductance, short connection leads can thus be implemented. In particular, the semiconductor components (dies, dices) can be placed directly on the substrate and connected directly (bonded) to connection lead sections arranged in or on the substrate. Both MOSFETs and drivers can be constructed as semiconductor components. If multiple terminal leads (bonding wires) are laid in parallel from the semiconductor components to the connection lead sections, then the connection is of particularly low inductance. The terminal leads together with the connection lead sections constitute connection leads. For example, the connection leads can also be directly wired (bonded) from semiconductor component to semiconductor component. Connection leads can be assembled on, in, or to the substrate with particularly low inductance. If the wired semiconductor components are accommodated in a closed housing, shorter safety margins can be implemented without the risk of discharges, because the risk of contamination is lower and, thus, shorter minimum creep distances can be implemented. If the wired semiconductor components are encapsulated in a housing, still shorter safety margins can be implemented without the risk of discharges, because instead of creep distances, insulation characteristics of the potting compound can now be taken into account.

In some implementations, space savings are achieved with a short current path and short connection leads between the components is obtained if at least the half-bridge and the bypass capacitor are integrated in a semiconductor component.

In some implementations, at least the switching elements are arranged on a heat sink. This allows direct cooling of the switching elements and thus a dissipation of power to take place. The heat sink can be constructed as a cooling plate or a multilayer circuit board. The heat sink can be constructed from, for example, a ceramic.

The connection leads between the bypass capacitor and the switching elements can be kept short and hence the lead inductances low, if the bypass capacitor is arranged above or below the switching elements. Even if the bypass capacitor is constructed as a substrate for the switching elements, extremely short connection leads can be implemented. In addition, the bypass capacitor can in this case also serve as a heat sink for the switching elements.

In some implementations, at least the half-bridge and the bypass capacitor can be combined into a module. In some implementations, a full bridge is also integrated in a module, but for a Class D operation this is not strictly necessary, as no particularly low-inductance paths are required between the two half-bridges. Implementations of the amplifier arrangement with only two switching elements connected in series also can have the additional advantage that it is less expensive to manufacture two half-bridge modules than one full-bridge module. Moreover, in a half-bridge module there are fewer components, thus the probability of a manufacturing fault is lower and the yield increases. A module can be a group of components representing a unit, and as such can be installed for example in an HF generator.

In some implementations, it can be provided that, apart from ground connections, the module has no connection to the heat sink. The module is thus electrically insulated relative to the heat sink.

Further advantages are obtained if all terminals on which a voltage ≦100 V is present are arranged as terminal pins or terminal tags on the side opposite to the heat sink. This measure allows a minimum creep distance to be maintained, which is necessary at high voltages. This is frequently not the case in terminals brought out at the side. Sheet metal strips (terminal tags) offer a lower resistance for high-frequency currents than leads with a round cross-section. With terminal tags directed upwards or terminal pins the amplifier arrangement can be arranged directly on the heat sink, without additional electric insulation plates, for a good thermal conductivity. The terminals can be connected to a circuit board, which is arranged above the modules, in particular being soldered to it.

In some implementations, two capacitors connected in series are provided between the supply voltage terminals. This measure allows a mid-point to be generated between a positive supply voltage +V and the negative supply voltage −V. Preferably these capacitors are also connected with a low inductance, i.e. with short terminal leads.

In some implementations, the capacitors are arranged in the module. In some implementations, it can be provided that the leads to the capacitors have a length of 10 mm or less, preferably 5 mm or less, particularly preferably 3 mm or less. This measure means that these capacitors are also connected with a low inductance.

In some implementations, one capacitor each is provided between the positive supply voltage and ground, and the negative supply voltage and ground. Ground can then be directly connected with low inductance to the heat sink.

Such a low-inductance connection is obtained in particular by the fact that the connecting lead from the heat sink to ground has a length of 10 mm or less, preferably 5 mm or less, particularly preferably 3 mm or less.

In another general aspect, an HF generator that includes an amplifier arrangement described above.

Further features and advantages of the techniques discussed above ensue from the following description of examples, from the figures, and from the claims. The individual features can be put into effect in a variant of the techniques discussed either individually, or in a plurality of any kind of combination.

DETAILED DESCRIPTION

Figure 1:
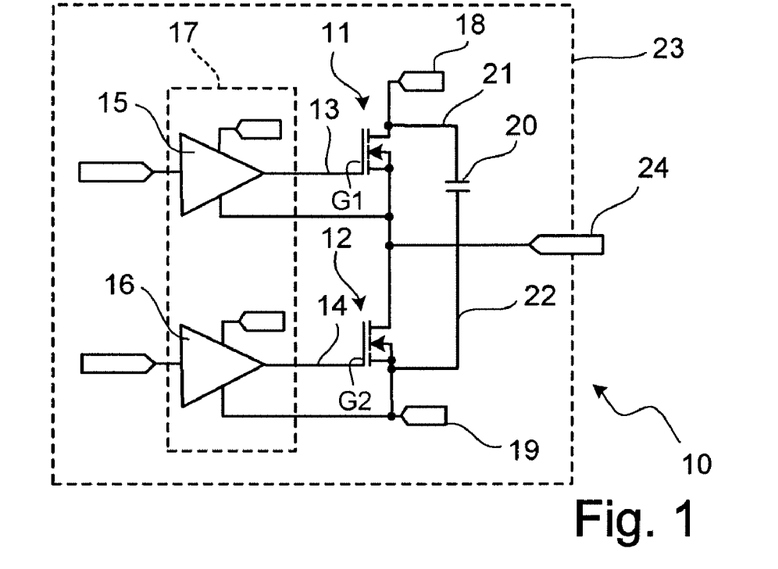
FIG. 1 is a schematic drawing of an implementation of a amplifier arrangement.

Referring to FIG. 1, an HF Class D amplifier arrangement 10 includes two switching elements 11, 12 connected in series to form a half-bridge. The switching elements 11, 12 can be, for example, MOSFETs. Control terminals G1, G2 of the switching elements 11, 12, respectively, are each driven by a driver component 15, 16 of a driver arrangement 17. Connection leads 13, 14 connect the driver arrangement 17 to the control elements G1, G2. In particular, the output of the driver component 15 is connected with connection lead 13 to the control element G1 and the output of driver component 16 is connected with connection lead 14 to the control element G2. The switching element 11 can be referred to as the higher switching element, and the switching element 12 can be referred to as the lower switching element. The higher switching element 11 is connected to a positive supply voltage 18 and the lower switching element 12 is connected to a negative supply voltage 19. The output terminal 24 lies between the switching elements 11, 12.

Parallel to the switching elements 11, 12, or between the positive and negative supply voltage 18, 19, a bypass capacitor 20 is connected. The connection between the switching elements 11, 12 and the connection leads 21, 22 to the bypass capacitor 20 are constructed with low inductance. This means that the connection leads 21, 22 are as short as possible. Thus, the current path through the switching elements 12, 13 and the bypass capacitor 20 is also therefore very short. In the example shown in FIG. 1, the entire amplifier arrangement 10 is arranged in a housing 23.

The switching elements 11, 12 have an output capacitance, which is not negligible in high-frequency applications. As discussed above, the switching elements 11, 12 can be MOSFETs. The output capacitance for MOSFETs is a drain-source capacitance, $C_{oss}$. At each switch-on operation with voltage applied, a MOSFET discharges its own drain-source capacitance via its on-resistance $R_{DSON}$ and consumes power in the process ($\frac{1}{2} CU^2$). The higher the frequency at which the MOSFET is switched on and off, the more energy that is converted into heat in the MOSFET. In the half-bridge one MOSFETs also recharges the drain-source capacitance of the other MOSFET, which at this point is inhibited, also causing an oscillation to be excited between the capacitance of the MOSFET and the inductance of the supply lead. Therefore, the MOSFETs (e.g., the switching elements 11, 12) of the half-bridge, when in switching mode at high-frequency and at high operating voltage, should switch on without potential. This is achieved by an inductive component of the load impedance, which, when a MOSFET is blocking, still allows sufficient current to continue flowing to recharge the capacitances of the MOSFET up to the counter-potential, before the other MOSFET switches on. The satisfaction of this condition is referred to as Zero Voltage Switching (ZVS).

In plasma processes, changes in load occur very frequently, and the changes in load can lead to load mismatches. Although these load mismatches can be overcome by the use of impedance matching networks, the impedance matching networks cause a time delay and often also incompletely correct the load mismatch. The interaction of switching bridge and load impedance for Class D operation can inhibit zero voltage switching when load mismatches occur.

The development of Class D amplifiers in high-frequency engineering (e.g., frequencies above 3 MHz) at high voltages and powers (e.g., 1 kW and higher) has been considered challenging for several reasons. Transistors for high power levels (1 kW and greater) have specific space requirements, because such transistors dissipate heat energy (see above, discharging of a capacitance via $R_{DSON}$) and distribute the current over a certain minimum surface area. The higher the voltage at which the transistors are operated, the greater the required distance between the terminal pins. This makes certain minimum dimensions desirable.

The current path from the positive supply voltage 18 through the switching elements 11, 12 to the negative supply voltage 19 can be referred to as the load current path. In addition to the load current path, there exists a parasitic current path. The parasitic current path includes the bypass capacitor 20, which is between the positive supply voltage 18 and the negative supply voltage 19. The bypass capacitor 20 prevents voltage dips in the supply voltage due to current pulses occurring during switching in the switching elements 11, 12. Moreover, the bypass capacitor 20 prevents the destruction of the switching elements 11, 12 due to current spikes. When connecting two transistors together (e.g., the switching elements 11, 12) to form a half-bridge and when connecting the bypass capacitor 20, parts of the load current path and parts of the parasitic current path are connected together to form a current path (loop), which includes the switching elements 11, 12 and the bypass capacitor 20. Supply leads from the supply voltage terminals are not included in the current path (loop). The current path (loop) has supply-lead inductances and capacitances, e.g. the output capacitance of the MOSFETs ($C_{oss}$), and thus forms a resonant circuit. The resonant circuit is excited by the switching on and off of the switching elements 11, 12. If the resonant circuit is excited, e.g. if the zero voltage switching can no longer be achieved, the resonant circuit oscillates mostly at much higher frequencies (e.g. 80 MHz) than the fundamental frequency (e.g. 13.56 MHz) of the resonant circuit.

These oscillations are unwanted in the plasma process and interfere with the functioning and the reliability of a high-frequency generator in which the half-bridge is used. Damping of the oscillations can help remove the oscillations; however, an effective damping of the resonant circuit is associated with power loss, which is undesirable for this high-power domain. As a result, Class D amplifiers have not generally been used for high power levels, in particular in plasma processes, and instead recourse was made to the amplifiers of Class B or C, which have a higher dissipation loss as compared to Class D amplifiers, or to a Class E amplifier. On the transistor of a Class E amplifier, relatively high voltages occur, so that more voltage-resistant and more expensive transistors are used. In those places where Class D amplifiers have been used at high power for plasma processes, the output signal was often not of the required quality and had too great a proportion of harmonics. These Class D amplifiers are generally not suitable for the constantly increasing requirements on processing quality.

However, a small length current path can allow construction of an amplifier arrangement, such as the amplifier arrangement 10, that has particularly low inductance, which can help reduce the unwanted oscillations. The unwanted oscillations that occur when a zero voltage switching is not possible due to a varying load are therefore shifted to high frequencies that are easier to damp, or due to the limiting of the switching speed of the switching elements 11, 12, can no longer even arise at all. Such an amplifier arrangement is particularly suited for use in HF generators for power levels above 1 kW with supply voltages above 100 V and frequencies of 3 MHz and higher.

Thus, in some implementations, the half-bridge and the bypass capacitor 20 are arranged on an area of 30 cm² or less, inductances in the current path can be kept so small that interfering parasitic oscillations are prevented or shifted to such high frequencies that they no longer cause interference or can be suppressed. The local concentration of the oscillation circuit reduces its influence on other circuits, in particular on the clock signal generation.

In some implementations, the (parasitic) resonant circuit formed by capacitances and inductances in the current path through the half-bridge and the bypass capacitor 20 has a resonance frequency at or above 100 MHz, and the resonance frequency arising from mismatches can be easily damped. As the capacitance $C_{oss}$ remains constant, a higher resonance frequency means that a higher discharge current occurs earlier, which in turn leads to increased Ohmic damping (Ohmic losses).

In some implementations, the connection leads 21, 22 between the bypass capacitor 20 and the switching elements 11, 12 and the lead between the switching elements 11, 12 are each of length of 10 mm or less, preferably 5 mm or less, and particularly preferably 3 mm or less, the switching elements 11, 12 are hard-wired together with particularly low inductance. Terminal leads (bonding wires) are here understood to be a component of the connection leads 21, 22. The short leads cause a shortening of the current path through the two switching elements 11, 12 and the parallel bypass capacitor 20, and thus a reduction of the inductances. The connection leads 21, 22 can have a planar embodiment, for example a connection lead can be constructed as a flat surface, e.g. as a copper track, or using many parallel conductors perhaps with the same width and length. The width and length of the connection leads, whereby the width can be defined by multiple parallel single connection leads, are therefore of the same order of magnitude. Preferably, the length and width of the connection leads are the same. This reduces the inductance of the conductor path.

In one implementation, at least one driver arrangement 17 can be provided. The driver arrangement 17 is connected to the control terminals G1,G2 of the switching elements 11, 12. The connection leads 13, 14 from the driver arrangement 17 to the switching elements 11, 12 have a length of 10 mm or less, 5 mm or less, or 3 mm or less. Accordingly, the inductances in the connection leads 13, 14 can also be reduced, so that a low-inductance connection of the driver arrangement 17 is possible. If the driver arrangement 17 is arranged closer to the switching elements 11, 12, in particular closer to the gates (or control terminals G1, G2) of the switching elements 11, 12, the switching elements 11, 12 are less susceptible to the Miller-feedback of the oscillation in the parasitic resonant circuit.

Figure 2:
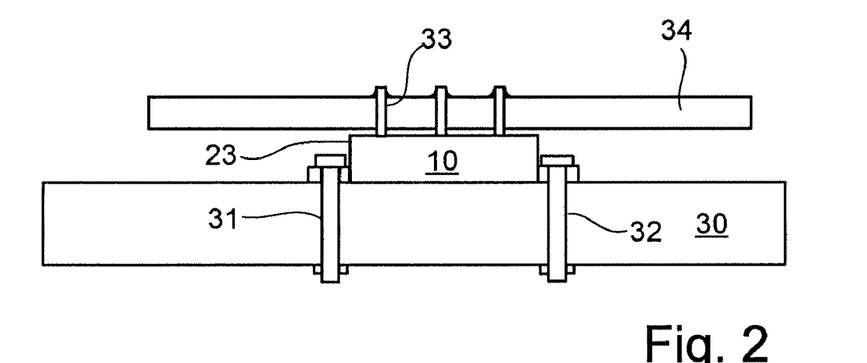
FIG. 2 is a side cross-sectional view of the amplifier arrangement of FIG. 1 on a heat sink.

Referring to FIG. 2, the amplifier arrangement 10, and in particular, the switching elements 11, 12 included in the amplifier arrangement 10 are arranged on a heat sink 30 and the housing 23 of the amplifier arrangement 10 is screwed onto the heat sink 30 with screws 31, 32. A ground connection is made from the amplifier arrangement 10 through the screws 31, 32 to the heat sink 30. Terminal pins 33 of the amplifier arrangement 10 are brought out of the housing 23 upwards, so that the terminal pins 33 can be connected to a printed circuit board 34, which is arranged above the amplifier arrangement 10.

Arranging the switching elements 11, 12 on the heat sink 30 allows direct cooling of the switching elements 11, 12 and thus a dissipation of power can take place. The heat sink 30 can be constructed as, for example, a cooling plate or a multilayer circuit board. The heat sink 30 can be constructed from, for example, a ceramic.

The connection leads between the bypass capacitor 20 and the switching elements 11, 12 can be kept short and hence the lead inductances low, if the bypass capacitor 20 is arranged above or below the switching elements 11, 12. Even if the bypass capacitor 20 is constructed as a substrate for the switching elements 11, 12, short connection leads can be implemented. In addition, the bypass capacitor 20 can in this case also serve as a heat sink for the switching elements 11, 12.

Figure 3:
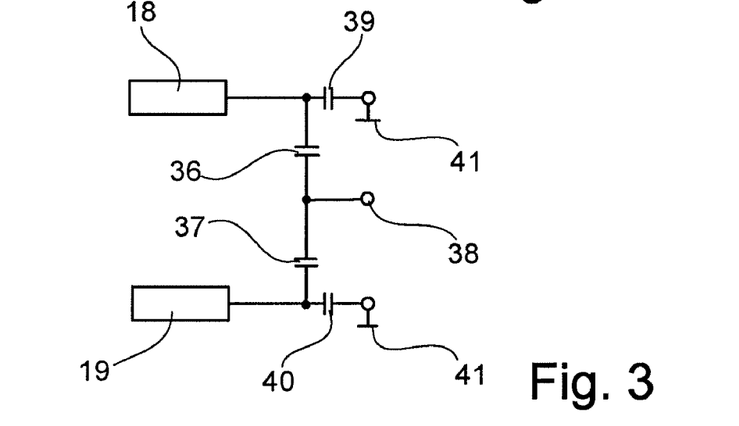
FIG. 3 is a schematic drawing of an example circuit for implementing a middle potential.

Referring to FIG. 3, in another implementation, two capacitors 36, 37 are shown, which are connected between the positive supply voltage 18 and the negative supply voltage 19. In this implementation, the two capacitors 36, 37 are used instead of the bypass capacitor 20, but capacitors 36, 37 can also be placed in addition to capacitor 20. The two capacitors 36, 37 are connected in series between the supply voltage terminals 18, 19. This implementation allows a mid-point to be generated between a positive supply voltage 18 and the negative supply voltage 19. The two capacitors 36, 37 are also connected with a low inductance, e.g. with short terminal leads. In some implementations, the capacitors are arranged in the module. In some implementations, the leads to the capacitors 36, 37 have a length of 10 mm or less, 5 mm or less, or 3 mm or less. Accordingly, the capacitors 36, 37 are also connected with a low inductance. Thus, a mid-point 38 (middle potential) is implemented between the supply voltages 18, 19. In addition, the capacitors 39, 40 are provided between the supply voltages 18, 19 and ground 41. The ground 41 can be connected with low inductance to the heat sink 30. The mid-point 38 lacks a direct connection to a midpoint of the half-bridge. The midpoint of the half-bridge may be the output terminal 24.

Figure 4:
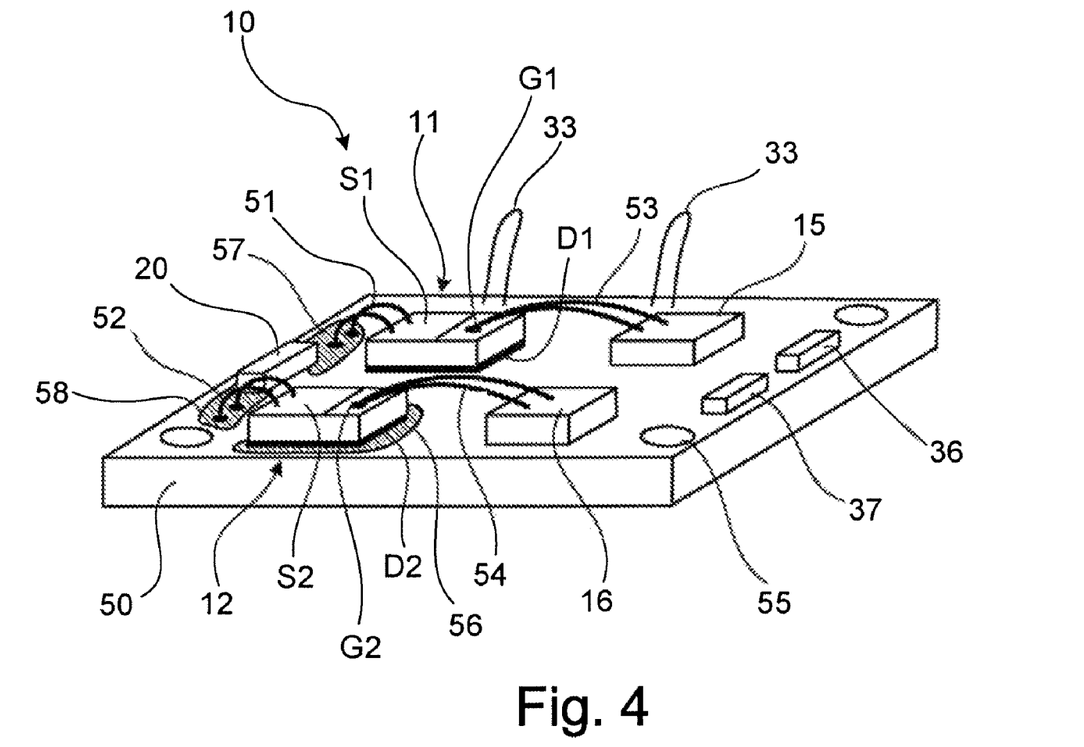
FIG. 4 is a perspective view of the amplifier arrangement of FIG. 1 arranged on a substrate.

Referring to FIG. 4, the amplifier arrangement 10 is shown mounted to a substrate 50. The switching elements 11, 12 are each constructed as semiconductor components (dies, dices) and arranged on the substrate 50, which can serve as a heat sink. The switching elements 11, 12 are placed with their drains D1, D2 respectively on the substrate 50 and are contacted from below. The source terminals S1, S2 lie at the top of the switching elements 11, 12, respectively. The source terminals S1, S2 are connected via terminal leads 51, 52, which are embodied as bonding wires, to connection lead sections 56, 57, 58 extending in the substrate 50. The terminal leads 51, 52 are also kept as short as possible and can be regarded as a component of the connection leads between components. The bypass capacitor 20 is also arranged on the substrate 50

The gate terminals (control terminals) G1, G2 also lie on top of the switching elements 11, 12 and are connected through terminal leads 53, 54, which are likewise embodied as bonding wires, to driver components 15, 16 arranged on the substrate 50. The capacitors 36, 37 are also arranged on the substrate 50. Terminal pins 33 or terminal tags extend from the substrate 50, in which the connection leads 21, 22, amongst other things, extend. The substrate has fixing devices 55—here through-holes—for fixing the substrate 50. In some implementations, the terminal leads 53, 54 are parallel to each other, which helps to lower inductance in the terminal leads 53, 54. The same signal is transmitted through the terminal leads 53, 54.

Mounting the elements on the substrate 50 can allow implementation of particularly low-inductance, short connection leads. In particular, the semiconductor components (dies, dices) can be placed directly on the substrate and connected directly (bonded) to connection lead sections 56, 57, 58 arranged in or on the substrate 50. Both the switching elements 11, 12 and the driver components 15, 16 can be constructed as semiconductor components. If multiple terminal leads (bonding wires) are laid in parallel from the semiconductor components to the connection lead sections 56, 57, 58, then the connection is of particularly low inductance. The terminal leads together with the connection lead sections 56, 57, 58 constitute connection leads. For example, the connection leads can also be directly wired (bonded) from semiconductor component to semiconductor component. Connection leads can be assembled on, in, or to the substrate 50 with particularly low inductance.

Figure 5:
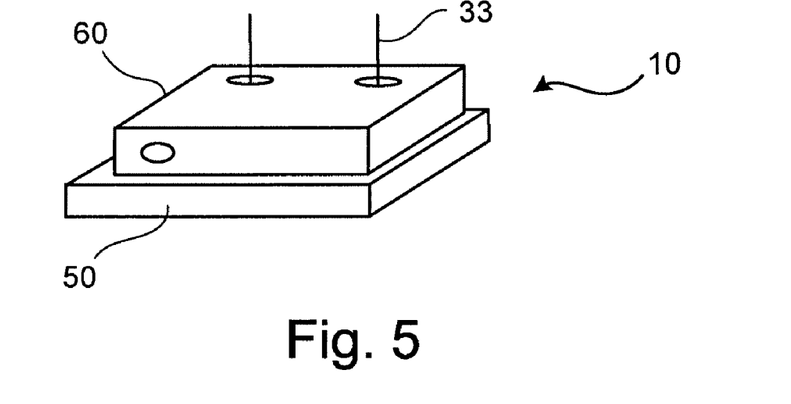
FIG. 5 is a perspective view of the amplifier arrangement of FIG. 1 in a housing and on a substrate.

Referring to FIG. 5, the amplifier arrangement 10 is arranged in a housing 60 on a substrate 50. The terminal pins 33 project upwards out of the housing 60. If the wired semiconductor components are accommodated in the closed housing 60 shorter safety margins can be implemented without the risk of discharges, because the risk of contamination is lower and, thus, shorter minimum creep distances can be implemented. If the wired semiconductor components are encapsulated in a housing, still shorter safety margins can be implemented without the risk of discharges, because instead of creep distances, insulation characteristics of the potting compound can now be taken into account.

Figure 6:
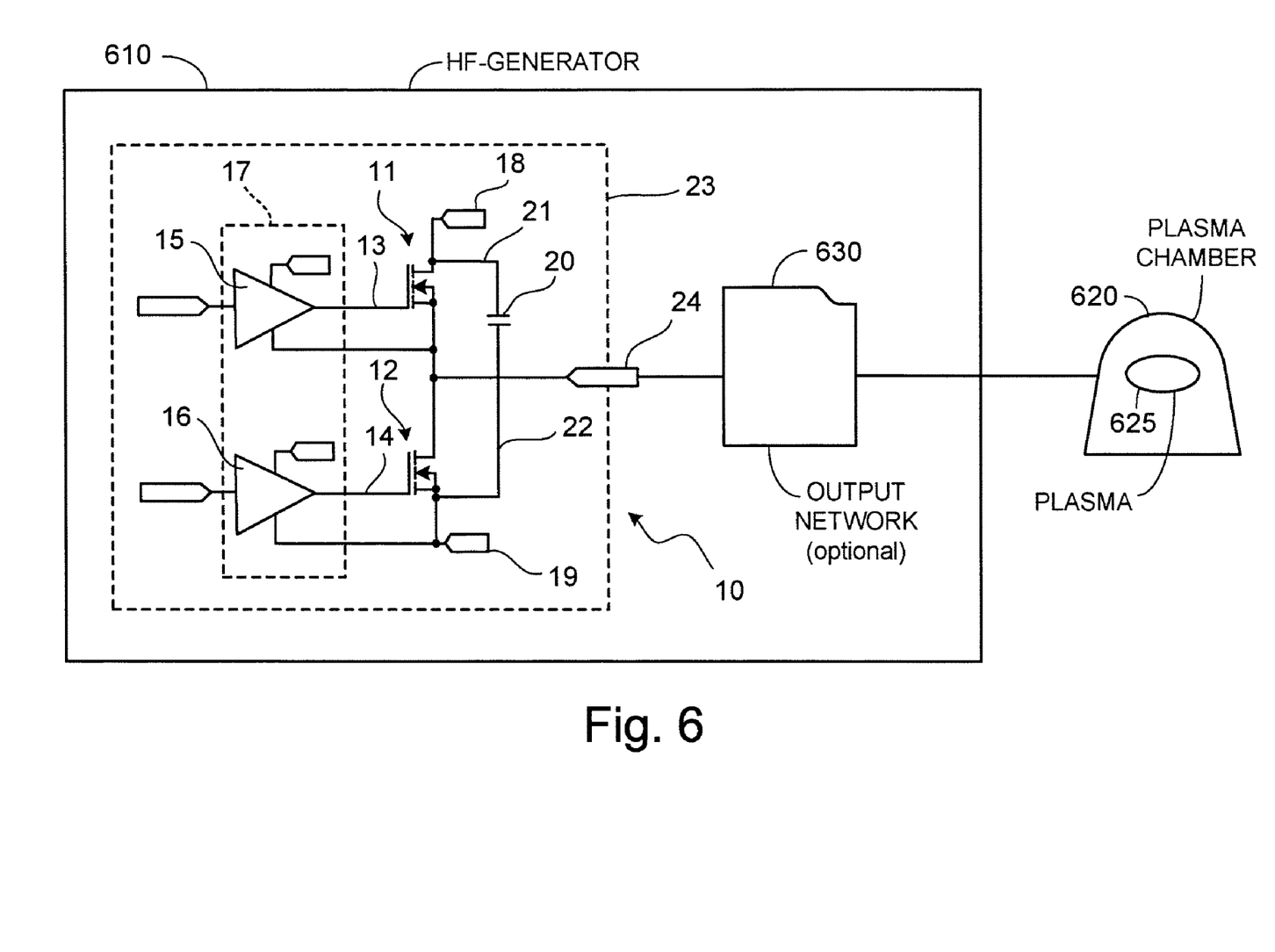
FIG. 6 is a schematic drawings of a high-frequency generator that includes the amplifier arrangement of FIGS. 1-5.

Referring to FIG. 6, a high-frequency generator 610 includes an amplifier arrangement 10, and the high-frequency generator 610 is connected to a plasma chamber 620. The plasma chamber 620 includes plasma 625. In some implementations, the high-frequency generator 610 can be connected to the plasma chamber 620 through an output network 630. The output network 630 can be connected to the amplifier arrangement through the output terminal 24, which lies between the switching elements 11, 12.

The foregoing description is intended to illustrate and not limit the scope of the techniques discussed above. Other aspects, advantages, and modifications are within the scope of the following claims.

What is claimed is:

1. An amplifier arrangement comprising:
a half-bridge formed from a first switching element and a second switching element connected in series, first and second supply voltage terminals, and an output connection between the first and second switching elements, wherein the first and second switching elements are MOSFETs, and the first and second switching elements are constructed as semiconductor components arranged on a common substrate that includes connection lead sections;
a bypass capacitor in parallel with the first and second switching elements; and
a current path through the first and second switching elements and the bypass capacitor, the current path including a first connection lead between the first switching element and the bypass capacitor and a second connection lead between the second switching element and the bypass capacitor, wherein the first and second connection leads are no longer than 10 mm each.

2. The amplifier arrangement of claim 1, wherein the amplifier arrangement is configured to operate at supply voltages of at least 100V and at output powers of at least 1 kW, and wherein
the current path has a length of 10 cm or less,
the half-bridge and the bypass capacitor are arranged on an area of 30 cm$^2$, and
a resonant circuit formed by capacitances and inductances in the current path has a resonance frequency of 100 MHz or greater.

3. The amplifier arrangement of claim 1, wherein the first and second connection leads are no longer than 5 mm each.

4. The amplifier arrangement of claim 1, wherein the first and second connection leads are no longer than 3 mm each.

5. The amplifier arrangement of claim 1, further comprising driver components in the form of semiconductor components that are arranged on the substrate.

6. The amplifier arrangement of claim 1, further comprising multiple parallel terminal leads arranged between the semiconductor components and connection lead sections of the substrate such that the semiconductor components and the connection lead sections are electrically connected.

7. The amplifier arrangement of claim 6, wherein at least two semiconductor components are directly connected.

8. The amplifier arrangement of claim 1, further comprising:
a first control terminal and a second control terminal associated with the first and second switching elements, respectively; and
at least one driver arrangement connected to the first and second control terminals, wherein connection leads from the driver arrangement to the first and second switching elements have a length of 10 mm or less.

9. The amplifier arrangement of claim 1, wherein the half-bridge and the bypass capacitor are integrated in a semiconductor component.

10. The amplifier arrangement of claim 1, wherein the first and second switching elements are arranged on a heat sink.

11. The amplifier arrangement of claim 10, wherein the heat sink comprises a ceramic material.

12. The amplifier arrangement of claim 1, wherein:
the first switching element is arranged on top of the second switching element, and
the bypass capacitor is arranged on top of the second switching element.

13. The amplifier arrangement of claim 1, wherein the bypass capacitor is constructed as the common substrate on which the first and second switching elements are arranged.

14. The amplifier arrangement of claim 1, wherein the half-bridge and the bypass capacitor are combined together into a module.

15. An amplifier arrangement comprising:
a half-bridge formed from a first switching element and a second switching element connected in series, first and second supply voltage terminals, and an output connection between the first and second switching elements;
a bypass capacitor in parallel with the first and second switching elements, wherein the half-bridge and the bypass capacitor are integrated in a semiconductor component; and
a current path through the first and second switching elements and the bypass capacitor, the current path including a first connection lead between the first switching element and the bypass capacitor and a second connection lead between the second switching element and the bypass capacitor, wherein the first and second connection leads are no longer than 10 mm each.

16. An amplifier arrangement comprising:
a half-bridge formed from a first switching element and a second switching element connected in series, first and second supply voltage terminals, and an output connection between the first and second switching elements;
a bypass capacitor in parallel with the first and second switching elements, wherein the bypass capacitor is constructed as a substrate on which the first and second switching elements are arranged; and
a current path through the first and second switching elements and the bypass capacitor, the current path including a first connection lead between the first switching element and the bypass capacitor and a second connection lead between the second switching element and the bypass capacitor, wherein the first and second connection leads are no longer than 10 mm each.

17. An amplifier arrangement comprising:
a half-bridge formed from a first switching element and a second switching element connected in series, first and second supply voltage terminals, and an output connection between the first and second switching elements;
a bypass capacitor in parallel with the first and second switching elements, wherein the half-bridge and the bypass capacitor are combined together into a module; and
a current path through the first and second switching elements and the bypass capacitor, the current path including a first connection lead between the first switching element and the bypass capacitor and a second connection lead between the second switching element and the bypass capacitor, wherein the first and second connection leads are no longer than 10 mm each.

18. An amplifier arrangement comprising:
a half-bridge formed from a first switching element and a second switching element connected in series, first and second supply voltage terminals, and an output connection between the first and second switching elements;
first and second capacitors connected in series between the first and second supply voltage terminals, wherein the midpoint of the first and second capacitors does not have a direct connection to the midpoint of the half-bridge, and the first and second capacitors and the first and second switching elements are arranged on a substrate;
a bypass capacitor in parallel with the first and second switching elements; and
a current path through the first and second switching elements and the bypass capacitor, the current path including a first connection lead between the first switching element and the bypass capacitor and a second connection lead between the second switching element and the bypass capacitor, wherein the first and second connection leads are no longer than 10 mm each.

19. The amplifier arrangement of claim 17, wherein ground connections are the only connection between the module and a heat sink.

20. The amplifier arrangement of claim 1 further comprising first and second capacitors connected in series between the first and second supply voltage terminals, wherein the midpoint of the first and second capacitors has no direct connection to the midpoint of the half-bridge.

21. The amplifier arrangement of claim 20, wherein the first and second capacitors and the first and second switching elements are arranged on the common substrate.

22. The amplifier arrangement of claim 18, wherein terminal leads to the first and second capacitors have a length of 10 mm or less.

23. The amplifier arrangement of claim 20 further comprising third and fourth capacitors between the first and second supply voltages and ground, respectively.

24. The amplifier arrangement of claim 10, wherein the heat sink is connected to ground through a connection lead, and a length of the connection lead is 10 mm or less.

25. The amplifier arrangement of claim 1, wherein the first and second connection leads each have a width that is comparable with a length of the first and second connection leads, respectively.

26. The amplifier arrangement of claim 1, wherein the amplifier is a class D amplifier.

27. A generator, the generator comprising:
an amplifier arrangement comprising:
a half-bridge formed from a first switching element and a second switching element connected in series, first and second supply voltage terminals, and an output connection between the first and second switching elements, wherein the first and second switching elements are MOSFETs, and the first and second switching elements are constructed as semiconductor components arranged on a common substrate that includes 5 connection lead sections;

a bypass capacitor in parallel with the first and second switching elements, and a current path through the first and second switching elements and the bypass capacitor, the current path including a first connection lead between the first switching element and the bypass capacitor and a second connection lead between the second switching element and the bypass capacitor, wherein the first and second connection leads are no longer than 10 mm each; and an output network configured to connect the amplifier to a plasma chamber through the output connection.

* * * * *